(12) United States Patent
Sommerville

(10) Patent No.: US 8,485,433 B2
(45) Date of Patent: Jul. 16, 2013

(54) TERMINAL FASCIA

(75) Inventor: David Sommerville, Edinburgh (GB)

(73) Assignee: NCR Corporation, Duluth, GA (US)

( * ) Notice: Subject to any disclaimer, the term of this patent is extended or adjusted under 35 U.S.C. 154(b) by 0 days.

(21) Appl. No.: 13/285,753

(22) Filed: Oct. 31, 2011

(65) Prior Publication Data

US 2013/0106260 A1    May 2, 2013

(51) Int. Cl.
  *G06Q 40/00*    (2012.01)
  *G07D 11/00*    (2006.01)
  *G07F 19/00*    (2006.01)

(52) U.S. Cl.
  USPC .......................................... 235/379; 235/381

(58) Field of Classification Search
  USPC .... 235/379, 383, 381; 902/10, 31; 705/39–45
  See application file for complete search history.

(56) References Cited

U.S. PATENT DOCUMENTS

| | | | |
|---|---|---|---|
| 6,508,397 B1* | 1/2003 | Do | 235/379 |
| 6,896,181 B2* | 5/2005 | Utz | 235/379 |
| 7,641,106 B1* | 1/2010 | Kovacs et al. | 235/379 |
| 7,810,715 B2* | 10/2010 | Herd et al. | 235/379 |
| 2001/0025881 A1* | 10/2001 | Shepherd | 235/379 |
| 2002/0074393 A1* | 6/2002 | Anderson et al. | 235/379 |
| 2007/0246524 A1* | 10/2007 | Booth et al. | 235/379 |
| 2009/0057398 A1* | 3/2009 | Douglass et al. | 235/379 |

FOREIGN PATENT DOCUMENTS

JP         200476387 A  *  3/2004

OTHER PUBLICATIONS

English Translation of JP 2004-76387A.*

* cited by examiner

*Primary Examiner* — Tuyen K Vo
(74) *Attorney, Agent, or Firm* — Michael Chan

(57) ABSTRACT

A fascia for a public access terminal is described. The fascia comprises: at least one user interface element on a front portion thereof (such as a customer display or a dispense slot), and a metal plate mounted on a rear portion thereof. The metal plate is dimensioned to close a metal body of the public access terminal so that the combination of the metal plate and the metal body provide a flame retardant public access terminal.

11 Claims, 2 Drawing Sheets

TERMINAL FASCIA

FIELD OF INVENTION

The present invention relates to an improved terminal fascia.

BACKGROUND OF INVENTION

Terminals that are free-standing, such as automated teller machines (ATMs) and other self-service terminals (SSTs), are classified as fire enclosures and need to meet fire safety certification. Such terminals typically include a fascia that defines a user interface. The fascia is typically made from a plastics material, and has to satisfy certain criteria for flammability of polymeric materials used for parts in devices and appliances so that it can meet the required certification. One such certifying body is Underwriters Laboratories (trade mark), which has a standard called UL 94 "Tests for Flammability of Plastic Materials for Parts in Devices and Appliances". This standard classifies plastics according to how quickly they burn in various orientations and thicknesses. The UL 94 standard classifications are (from least flame-retardant to most flame-retardant): HB, V2, V1, V0, 5VB, 5VA.

ATMs are public access devices that are typically located in public areas, so a high level of flame-retardant classification (for example, 5VA on the UL 94 scale) is required. This does not present a problem for ATMs that are manufactured in high volumes because the plastic used for a fascia can be injection moulded with the required additives to meet this level. However, for low-volume ATMs, it is not cost-effective to build a tool and use injection moulding. Instead, a fascia is typically created (by machining) from a solid block of resin material. It is very difficult to meet the highest level flame-retardant classification using this type of manufacturing process because the resin material does not have the required flame-retardant properties.

It would be advantageous to be able to provide a terminal having a plastic fascia that can meet the higher levels of flame-retardant classifications without having to injection mould the fascia.

SUMMARY OF INVENTION

Accordingly, the invention generally provides a plastic fascia comprising a metal plate located between the plastic fascia and a terminal body so that the metal plate closes the terminal body, thereby ensuring that the metal plate and the terminal body enclose fire hazards.

By enclosing the fire hazards behind the metal plate, the plastic fascia does not need to meet the flame-retardant classification for the fire enclosure because the metal plate provides the flame-retardant properties.

In addition to the Summary of Invention provided above and the subject matter disclosed below in the Detailed Description, the following paragraphs of this section are intended to provide further basis for alternative claim language for possible use during prosecution of this application, if required. If this application is granted, some aspects may relate to claims added during prosecution of this application, other aspects may relate to claims deleted during prosecution, other aspects may relate to subject matter never claimed. Furthermore, the various aspects detailed hereinafter are independent of each other, except where stated otherwise. Any claim corresponding to one aspect should not be construed as incorporating any element or feature of the other aspects unless explicitly stated in that claim.

According to a first aspect there is provided a fascia for a public access terminal, the fascia comprising at least one user interface element on a front portion thereof, and a metal plate mounted on a rear portion thereof, the metal plate being dimensioned to close a metal body of the public access terminal.

The user interface element may comprise a keypad, a display, a card reader, a card reader slot, a dispenser slot, a deposit slot, or the like.

The metal plate may define one or more slots (or apertures), each slot aligning with a terminal device located within the public access terminal.

The metal plate may comprise a plurality of metal components mutually coupled to provide a continuous metal barrier. The continuous metal barrier may define one or more slots and may be planar or non-planar (for example, contoured).

The public access terminal may comprise a self-service terminal. The self-service terminal may be an automated teller machine (ATM), an information kiosk, a financial services centre, a bill payment kiosk, a lottery kiosk, a postal services machine, a check-in and/or check-out terminal such as those used in the retail, hotel, car rental, gaming, healthcare, and airline industries, and the like.

According to a second aspect there is provided a public access terminal comprising:
a metal body defining an opening;
one or more terminal devices mounted within the metal body;
a fascia coupled to the metal body and including a metal plate dimensioned to close the opening so that the metal body and the metal plate co-operate to provide a fire-retardant chamber enclosing the terminal devices.

The fascia may further comprise at least one user interface element on a front portion thereof, where the front portion is on an opposite side of the fascia to the metal plate.

The at least one user interface element on the front portion of the fascia may comprise an aperture through which a user accesses one of the terminal devices. For example, one of the terminal devices (located within the terminal) may comprise a motorised card reader, and a user interface element included on the fascia may comprise a card slot.

The metal plate may include apertures to enable a user to access terminal devices within the fire-retardant chamber from the front portion of the fascia.

According to a third aspect there is provided a method of retro-fitting a public access terminal so that the retro-fitted terminal complies with a desired level of flame-retardant certification, the method comprising:
identifying a public access terminal having a fascia that does not meet the desired level of flame-retardant certification and a terminal body enclosing terminal devices;
providing a metal plate defining apertures corresponding to apertures in the fascia and dimensioned to close an opening defined by the terminal body; and
mounting the metal plate onto the fascia so that the terminal body and the metal plate co-operate to provide a fire-retardant chamber enclosing the terminal devices.

By virtue of these aspects a public terminal is provided that can meet the higher levels of flame-retardant classification because a metal chamber is provided and the plastic fascia is located outside the metal chamber.

For clarity and simplicity of description, not all combinations of elements provided in the aspects recited above have been set forth expressly. Notwithstanding this, the skilled person will directly and unambiguously recognise that unless it is not technically possible, or it is explicitly stated to the contrary, the consistory clauses referring to one aspect are intended to apply mutatis mutandis as optional features of every other aspect to which those consistory clauses could possibly relate.

These and other aspects will be apparent from the following specific description, given by way of example, with reference to the accompanying drawings.

DETAILED DESCRIPTION

Figure 1:
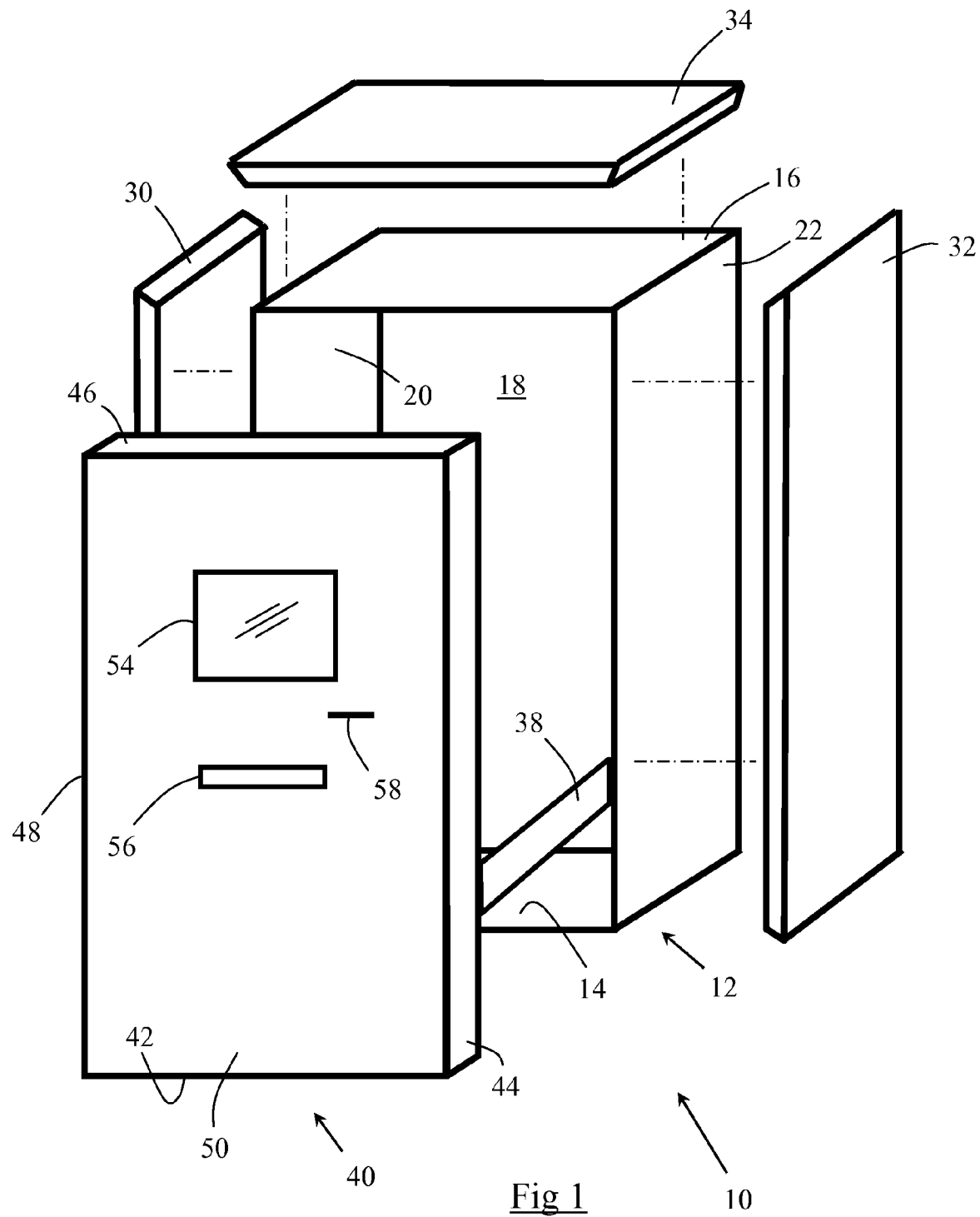
FIG. 1 is a simplified schematic exploded diagram of a public access terminal (in the form of an ATM) according to one embodiment of the present invention.

Referring first to FIG. 1, a public access terminal 10 (in the form of an ATM) is shown in simplified exploded schematic form. The ATM 10 has a metal body 12 comprising: a base 14, a top 16, a rear (or back) wall 18, a left sidewall 20 extending between the base 14 and the top 16, and a right sidewall 22 also extending between the base 14 and the top 16.

The ATM 10 includes decorative plastic panels for covering the sidewalls 20,22 and the back wall 18; however, only the left panel 30 and the right panel 32 are illustrated in FIG. 1. The ATM 10 also includes a decorative plastic top panel 34.

Sliding rails 38 are mounted to the sidewalls 20,22 and are coupled to a fascia 40. These sliding rails 38 allow the fascia 40 to be racked in and out so that the fascia 40 closes the metal body 12 when racked in, and allows access to terminal devices (not illustrated) within the ATM 10 when the fascia 40 is racked out.

The fascia 40 comprises a plastic shell machined from a block of resin. The plastic shell comprises four edge walls 42,44,46,48 extending orthogonally from a user interface surface 50 (which is an outer surface). When the fascia 40 is closed, the four edge walls 42 to 48 overlap front portions of the base 14, top 16, and sidewalls 20,22.

The user interface surface 50 includes various user interface elements mounted thereon or defined thereby. These user interface elements include: a customer display 54, a dispense slot 56, and a dip card reader 58.

Figure 2:
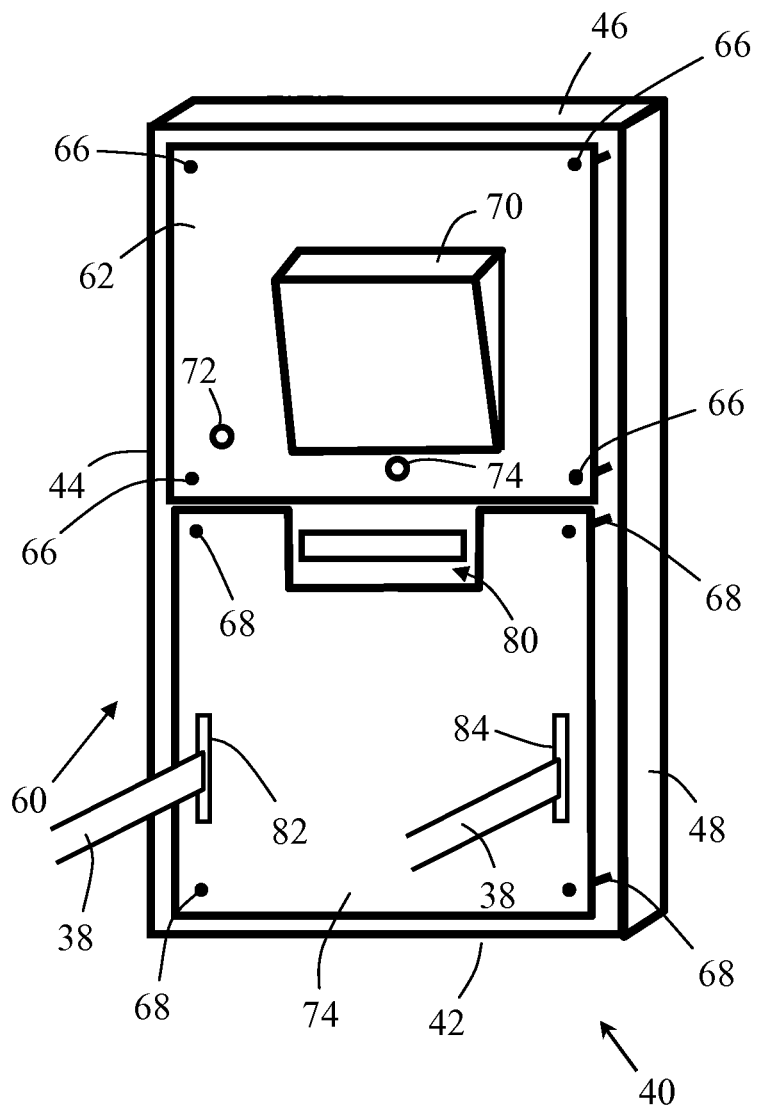
FIG. 2 is a simplified schematic diagram of part (a fascia) of the ATM of FIG. 1.

Reference will now also be made to FIG. 2, which is a simplified schematic diagram of the fascia 40 viewed from the rear.

Mounted on the rear of the fascia 40 is a metal plate 60 comprising two metal plate components 62,64. An upper plate component 62 covers a rear portion of the customer display 54 and the dip card reader 58. A lower plate component 64 is coupled to the upper plate component 62, and partially surrounds the dispense slot 56.

Four spacer bolts 66 are used to couple the upper plate component 62 to the fascia 40; similarly, four spacer bolts 68 couple the lower plate component 64 to the fascia 40.

The upper plate component 62 defines a protrusion 70 that is aligned with and dimensioned to accommodate the rear portion of the customer display 54. The upper plate component 62 also defines a plurality of cable apertures 72,74 (two of which are illustrated in FIG. 2) through which cables from user interface elements can be routed, thereby connecting a user interface element (such as the customer display 54) with an ATM device within the body 12 (such as an ATM controller (not illustrated)). In this embodiment, a separate cable aperture is provided for each of the customer display 54 and the dip card reader 58.

The lower plate component 64 defines a U-shaped recess 80. A nose portion of a media dispenser module (not shown) located within the ATM body 12 protrudes into this recess 80 when the fascia 40 is racked into the ATM body 12. The lower plate component 64 also defines vertical slots 82,84 in which the sliding rails 38 are mounted. These sliding rails 38 enable the ATM fascia 40 to rack into and out of the ATM body 12.

When the ATM fascia 40 is racked into the ATM body 12, the metal plate 60 abuts the front surfaces of the base 14, the top 16, the left sidewall 20, and the right sidewall 22. This ensures that the metal plate 60 substantially seals the body 12, thereby providing a flame-retardant enclosure that can satisfy levels 5VB and/or 5VA of the UL94 specification.

Various modifications may be made to the above described embodiment within the scope of the invention, for example, different, or additional, user interface elements may be provided than those described in the above embodiment.

In other embodiments, the metal plate may comprise a single metal component or more than two metal plate components. The metal plate may be contoured rather than planar.

In other embodiments, a greater or fewer number of cable apertures may be provided than the two described above.

The terms "comprising", "including", "incorporating", and "having" are used herein to recite an open-ended list of one or more elements or steps, not a closed list. When such terms are used, those elements or steps recited in the list are not exclusive of other elements or steps that may be added to the list.

Unless otherwise indicated by the context, the terms "a" and "an" are used herein to denote at least one of the elements, integers, steps, features, operations, or components mentioned thereafter, but do not exclude additional elements, integers, steps, features, operations, or components.

The presence of broadening words and phrases such as "one or more," "at least," "but not limited to" or other similar phrases in some instances does not mean, and should not be construed as meaning, that the narrower case is intended or required in instances where such broadening phrases are not used.

What is claimed is:

1. A fascia for a public access terminal having a metal body, the fascia comprising:
    at least one user interface element on a front portion of the fascia, and
    a metal plate mounted on a rear portion of the fascia, the metal plate being dimensioned to close the metal body of the public access terminal when the fascia is moved from a racked out position to a racked in position and thereby to substantially seal the metal body to provide a flame-retardant enclosure for terminal devices within the public access terminal.

2. A fascia according to claim 1, wherein the user interface element comprises a keypad, a display, a card reader, a card reader slot, a dispenser slot, or a deposit slot.

3. A fascia according to claim 1, wherein the metal plate defines one or more slots, each slot aligning with a terminal device located within the public access terminal.

4. A fascia according to claim 3, wherein the metal plate comprises a plurality of metal components mutually coupled to provide a continuous metal barrier.

5. A fascia according to claim 4, wherein the continuous metal barrier defines one or more slots.

6. A fascia according to claim 5, wherein the metal plate is non-planar.

7. A public access terminal comprising:
    a metal body defining an opening;

one or more terminal devices mounted within the metal body; and a fascia coupled to the metal body and including a metal plate dimensioned to close the opening so that the metal body and the metal plate co-operate to provide a fire-retardant chamber enclosing the terminal devices.

8. A public access terminal according to claim 7, wherein the fascia further comprises at least one user interface element on a front portion thereof, where the front portion is on an opposite side of the fascia to the metal plate.

9. A public access terminal according to claim 8, wherein the at least one user interface element on the front portion of the fascia comprises an aperture through which a user accesses one of the terminal devices.

10. A public access terminal according to claim 7, wherein the metal plate includes apertures to enable a customer to access terminal devices within the fire-retardant chamber from the front portion of the fascia during a transaction.

11. A method of retro-fitting a public access terminal so that the retro-fitted terminal complies with a desired level of flame-retardant certification, the method comprising:

identifying a public access terminal having a fascia that does not meet the desired level of flame-retardant certification and a terminal body enclosing terminal devices;

providing a metal plate defining apertures corresponding to apertures in the fascia and dimensioned to close an opening defined by the terminal body; and mounting the metal plate onto the fascia so that the terminal body and the metal plate co-operate to provide a fire-retardant chamber enclosing the terminal devices.

* * * * *